United States Patent [19]

Brandmayr

[11] Patent Number: 4,626,316

[45] Date of Patent: Dec. 2, 1986

[54] METHOD OF CHEMICALLY POLISHING QUARTZ CRYSTAL BLANKS

[75] Inventor: Ronald J. Brandmayr, Ocean, N.J.

[73] Assignee: The United States of America as represented by the Secretary of the Army, Washington, D.C.

[21] Appl. No.: 781,166

[22] Filed: Sep. 30, 1985

[51] Int. Cl.$^4$ .............................................. C03C 15/00
[52] U.S. Cl. .................................. 156/637; 156/663; 156/903; 252/79.3
[58] Field of Search ...................... 156/637, 663, 903; 252/79.5, 79.3

[56] References Cited

U.S. PATENT DOCUMENTS

| | | | |
|---|---|---|---|
| 3,374,141 | 3/1968 | Junge et al. | 156/663 |
| 3,855,024 | 12/1974 | Lim | 156/903 |
| 4,130,771 | 12/1978 | Bottom | 310/312 |
| 4,274,907 | 6/1981 | Vig et al. | 156/637 |
| 4,375,604 | 3/1983 | Vig | 310/312 |
| 4,416,726 | 11/1983 | Vig | 156/663 |
| 4,430,149 | 2/1984 | Berkman | 156/662 |
| 4,530,736 | 7/1985 | Mutter | 156/643 |

*Primary Examiner*—Peter Hruskoci
*Attorney, Agent, or Firm*—Sheldon Kanars; Jeremiah G. Murray; Roy E. Gordon

[57] ABSTRACT

Quartz crystal blanks are chemically polished by thoroughly cleaning the blanks, treating the quartz crystal blanks with an etching solution at high pressures in a high pressure vessel while agitating to circulate the etchant and maintaining a uniform temperature throughout the etching solution, cooling the vessel, removing the quartz crystal blanks, rinsing thoroughly with water and spinning dry.

13 Claims, No Drawings

METHOD OF CHEMICALLY POLISHING QUARTZ CRYSTAL BLANKS

The invention described herein may be manufactured, used and licensed by or for the Government for governmental purposes without the payment to me of any royalty thereon.

This invention relates in general to a method of chemically polishing quartz crystal blanks and in particular to such a method wherein the chemically polished quartz crystal blanks will be suitable for use in resonators and oscillators.

BACKGROUND OF THE INVENTION

It is known that quartz crystal blanks can be chemically polished by etching in a fluoride type etchant over a broad range of conditions. The quality of chemical polish depends primarily on the surface finish prior to etching, the depth of etch and the quality of quartz used. The speed of polishing depends primarily on the temperature of the etching bath for a given etchant.

The above set forth conventional method of chemically polishing quartz crystal blanks though generally satisfactory does have certain deficiencies. In particular, in the case of an SC-cut doubly rotated quartz crystal blank which has widespread use in resonators and oscillators, the quartz blank has a fast etch side and a slow etch side. When the conventional method of polishing is used, the slow etch side of the crystal lags the fast etch side so that it does not polish to the same degree of surface smoothness even though etched to the same depth of etch.

In the case of an AT-cut quartz crystal blank which also has widespread use in resonators and oscillators, another deficiency arises. That is, while it is well known that sodium hydroxide will etch quartz crystals, it has not been demonstrated that it can be used to chemically polish lapped AT-cut blanks. This may be due to the fact that the reaction rate is so slow that it is not practical to do so with the conventional method.

Another problem with the conventional process is the evaporation of etchant which causes the etch rate of the etchant to constantly change.

Another difficulty with the conventional etching method has been its inability to practically use dilute solutions of etchants.

SUMMARY OF THE INVENTION

The general object of this invention is to provide a method of chemically polishing quartz crystal blanks. A more specific object is to provide such a method wherein the resulting chemically polished blanks will be suitable for use in resonators and oscillators. A further object of the invention is to provide such a method wherein the aforementioned problems are overcome.

It has now been found that the aforementioned problems can be overcome and a method provided of chemically polishing quartz crystal blanks suitable for use in resonators and oscillators by thoroughly cleaning the quartz crystal blanks, treating the quartz crystal blanks with an etching solution at high pressures in a high pressure vessel while agitating to circulate the etchant and maintaining a uniform temperature throughout the etching solution, cooling the vessel, removing the quartz crystal blanks and then thoroughly rinsing the quartz crystal blank with water, and spinning dry.

The method of the invention requires that the quartz crystal blank be thoroughly cleaned prior to pressure polishing.

Any type of crystal can be treated according to the invention. The method of the invention is most applicable however to the AT-cut and SC-cut quartz crystal blanks which are the crystals most widely used in resonators and oscillators. In the case of the AT-cut, the etchant may be $NH_4F:HF$ or NaOH solutions. It is important to note in this regard that an etchant that will polish one type of quartz crystal blank may not polish another.

The high pressure vessel used in the invention must be inert to corrosive chemicals used to etch quartz. Such a vessel can conveniently be a teflon lined high pressure autoclave which has built in magnetic stirring. The stirring and agitation circulates the etchant and maintains a uniform temperature throughout the etching solution. The temperature can range from 65° C. to 150° C. with a temperature of about 85° C. preferred.

The gas pressure can be supplied by nitrogen or an inert gas. The range of pressure is from 400 psi to 1500 psi with a pressure range of 450 to 800 psi being preferred.

The pressure polishing can take from about 2 hours up to about 20 hours. The duration of pressure polishing is determinable from the rate of etching of the particular etchant and the desired depth of etching to obtain the desired frequency.

DESCRIPTION OF THE PREFERRED EMBODIMENT

Quartz crystal blanks such as SC-cuts, AT-cuts and others are thoroughly cleaned and then chemically polished in a teflon-lined high pressure autoclave which has built in magnetic stirring. The teflon lining enables the use of hydrofluoric acid based etching solutions and other corrosive solutions in the autoclave. Teflon fixtures are designed and machined to hold and support the quartz crystal blanks in the autoclave while being chemically milled or etched by the etchant.

The crystal blanks are inserted in the teflon holder which is supported by teflon fixtures in the autoclave. The chamber is filled with about 150 ml of etching solution. The capacity of the autoclave chamber is 250 ml. The combination of etching solution and fixtures fills the chamber almost to capacity.

The autoclave is then sealed tight using a teflon gasket and steel clamps to obtain the gas, prevent evaporation of etchant, and maintain a constant etch rate. A pressure-sealed, teflon-clad thermocouple is immersed in the etching solution through the cover to measure temperature.

The chamber is then filled with nitrogen gas to a pressure of about 750 psi. Higher pressures can be used up to about 1450 psi. the magnetic stirring is turned on to circulate the etchant and maintain uniform temperature throughout the etching solution. The autoclave, which sits within a heating mantle, is then heated slowly to about 85° C. The crystals are then etched at this temperature for the required length of time which typically may be 2.5 hours or as long as 20 hours. The maximum rated temperature of the autoclave is 250° C. When the etching time is completed, the heating mantle is turned off and the autoclave is cooled. When the temperature reaches about 50° C. or less, the nitrogen gas is released and the polished crystals are removed.

After removal, the crystals are rinsed thoroughly with water and spun dry.

By using suitable lithographic techniques, quartz crystals can be masked and pressure-polished to yield inverted-mesa or ring-supported resonators having sharp boundary definitions for use in high frequency resonators from 50 mHz to 1 GHz in range.

According to the method of the invention an SC-cut, doubly rotated quartz crystal blank can be polished on both sides to a high degree of polish, a polish superior to that achieved by the conventional method. The quality of polish and degree of surface smoothness on both sides of the crystal are observed to be indistinguishable from each other. Surface profile measurements indicate a surface smoothness of 0.04 μm on both sides of the crystal. Scanning Electron Microscopy (SEM) analysis indicates a superior polish on both sides of the crystal. Visually, the crystals show a polish superior to the crystals polished by the conventional method. The SC-cut has a fast etch and slow etch side of the crystal blank. When the conventional method of chemical polishing is used, the slow etch side of the crystal lags the fast etch side so that it does not polish to the same degree of smoothness when etched to the same depth of etch. The difference can be observed by eye. The crystals used in the method were 5 MHz-F, natural quartz, 0.550" in diameter having a one micron (1 μm) lapped surface.

The method of the invention enables the chemical polishing of AT-cut quartz crystals in sodium hydroxide (NaOH) etching solutions. While it is well known that NaOH will etch quartz crystals, it has not been demonstrated that it can be used to chemically polish lapped AT-cut blanks. One reason for this may be that the reaction rate is so slow that it is not practical to do so with the conventional process. However, the pressure-polishing technique enables speeding up of the reaction rates, and it has been shown in the method of the invention that NaOH solution will polish the AT-cut crystal.

Evaporation of etchant is a problem with the conventional method which causes the etch rate of the etchant to constantly change. The method of this invention eliminates evaporation of the etchant. Thus, the etchant does not have to be replenished and the etching rate remains constant.

Pressure-polishing increases the practicalilty of using dilute solutions of etchants which give a better polish than concentrated solutions because the method increases their etching rates. For example, an etching solution of $NH_4F:HF=10:1$ is observed to have an increased etching rate when compared to the conventional method—about 1.5 times as fast. A superior polish is obtained on crystals etched in this manner than would normally be observed using the conventional method with a solution of $NH_4F:HF=4:1$.

The pressure-polishing method will also provide a method of etching inverted-mesa and ring support structures of high frequency resonators in the range from 50 mHz to 1 GHz.

I wish it to be understood that I do not desire to be limited to the exact details as described for obvious modifications will occur to a person skilled in the art.

What is claimed is:

1. Method of chemically polishing quartz crystal blanks selected from the groups consisting of AT-cut quartz crystal blanks and SC-cut quartz crystal blanks so the quartz crystal blanks will be suitable for use in resonators and oscillators, said method including the steps of:
    (a) thoroughly cleaning the quartz crystal blanks,
    (b) treating the quartz crystal blanks with an etching solution selected from the group consisting of $NH_4F.HF$ solution and NaOH solution at pressures of about 750 psi to about 1450 psi in a high pressure vessel while agitating to circulate the etchant and maintaining a temperature of about 85° C. throughout the etching solution for a time effective to polish said blanks,
    (c) cooling the vessel to about 50° C.,
    (d) removing the quartz crystal blanks and then thoroughly rinsing the quartz crystal blank with water, and
    (e) spinning dry the quartz crystal blanks.

2. Method according to claim 1 wherein the quartz crystal blanks chemically polished are AT-cut quartz crystal blanks.

3. Method according to claim 1 wherein the quartz crystal blanks chemically polished are SC-cut quartz crystal blanks.

4. Method according to claim 3 wherein the etchant is $NH_4F:HF=4:1$ to 10:1 solution.

5. Method according to claim 1 wherein the etchant is $NH_4F:HF$ solution.

6. Method according to claim 1 wherein the etchant is NaOH solution.

7. Method according to claim 1 wherein the high pressure vessel is a teflon-lined high pressure autoclave.

8. Method according to claim 7 wherein etchant is sealed in the chamber of the autoclave preventing evaporation of the etchant and maintaining a constant etch rate.

9. Method according to claim 1 wherein agitation of the etchant is provided by a magnetic stirrer.

10. Method according to claim 1 wherein the pressure is provided by nitrogen gas to a pressure of about 750 pounds per square inch.

11. Method according to claim 1 wherein the pressure is provided by an inert gas to a pressure of about 750 pounds per square inch.

12. Method according to claim 1 wherein the etching time is from about 2.5 hours to as long as about 20 hours.

13. Method according to claim 1 wherein the quartz cyrstals are masked and pressure-polished to yield inverted-mesa or ring-supported resonators having sharp boundary definitions for use in high frequency resonators from 50 mHz to 1 GHz in range.

* * * * *